United States Patent [19]

Yamamura

[11] Patent Number: 4,751,562
[45] Date of Patent: Jun. 14, 1988

[54] FIELD-EFFECT SEMICONDUCTOR DEVICE

[75] Inventor: Shigeyuki Yamamura, Sagamihara, Japan

[73] Assignee: Fujitsu Limited, Kawasaki, Japan

[21] Appl. No.: 105,472

[22] Filed: Sep. 30, 1987

Related U.S. Application Data

[63] Continuation of Ser. No. 821,126, Jan. 22, 1986, abandoned, which is a continuation of Ser. No. 508,545, Jun. 28, 1983, abandoned.

[30] Foreign Application Priority Data

Jun. 30, 1982 [JP] Japan .................. 57-113253

[51] Int. Cl.$^4$ .................. H01L 27/02; H01L 29/06; H01L 29/80; H03F 3/14
[52] U.S. Cl. .................. 357/51; 357/55; 357/22; 357/74; 357/80; 330/307; 330/277; 330/107
[58] Field of Search .................. 357/51, 55, 22, 74, 357/80; 330/307, 277, 107

[56] References Cited

U.S. PATENT DOCUMENTS 3,969,745  7/1976  Blocker, III .................. 357/55
3,986,196  10/1976  Decker et al. .................. 357/55
4,183,041  1/1980  Goel .................. 357/74
4,456,888  6/1984  Ayasli .................. 330/277

OTHER PUBLICATIONS

Archer et al.; I.E.E.E. Journal of Solid-State Circuits; vol. SC-16; No. 6; Dec. 1981; pp. 648-652.

Primary Examiner—Martin H. Edlow
Assistant Examiner—Robert P. Limanek
Attorney, Agent, or Firm—Staas & Halsey

[57] ABSTRACT

A field-effect semiconductor device including a through-hole electrode formed so as to penetrate from the top to the bottom of the semiconductor substrate, a dielectric film formed on the semiconductor substrate so as to be opposite to the through-hole electrode, and an electrode, forming a through-hole type of passive element, such as a capacitor, so as to improve the integration degree.

12 Claims, 6 Drawing Sheets

4,751,562

FIELD-EFFECT SEMICONDUCTOR DEVICE

This is a continuation of co-pending application Ser. No. 821,126, filed on Jan. 22, 1986, which is a continuation of U.S. application Ser. No. 508,545, filed June 28, 1983, both now abandoned.

BACKGROUND OF THE INVENTION (1) Field of the invention

The present invention relates to an improvement of a field-effect semiconductor device having a capacitor and a field-effect transistor (FET), at least one electrode of the FET being grounded via the capacitor. More particularly, the capacitor is formed by means of a through hole in the semiconductor substrate.

(2) Description of the Prior Art

A field-effect semiconductor device generally includes active elements, such as gallium arsenide (GaAs) FETs and diodes, and passive elements, such as capacitors, resistors, inductors, and so forth. For example, when a field-effect semiconductor device employs a self-bias circuit so that the GaAs FET can be driven by a single power supply, a capacitor should be connected between the source electrode of the GaAs FET and ground, and when the field-effect semiconductor device is a low-pass filter type of matching circuit, capacitors, inductors, and GaAs FETs should be formed in the device. As an active element, a through-hole type of GaAs FET described in detail later, is known. In a conventional through-hole type of GaAs FET, one electrode thereof is directly grounded via a through-hole electrode inserted into the through-hole. Therefore, it is impossible to connect a capacitor between the electrode of the through-hole type of GaAs FET and ground (described in detail later). Accordingly, the conventional through-hole type of GaAs FET cannot employ a self-bias circuit.

Conventionally, when a field-effect semiconductor device such as a self-bias circuit or a matching circuit is formed on a semiconductor chip, passive elements, such as capacitors or resistors, are formed at the surface of the semiconductor chip in such a manner that they have planar structures. That is, each passive element requires an area which is not used by the other elements. Therefore, these passive elements occupy a considerable area on the semiconductor chip, thereby inhibiting improvement in the integration degree and causing complex wiring to have poor grounding characteristics.

Thus, there is a need to realize a field-effect semiconductor device in which passive elements such as capacitors or resistors have lateral structures formed in the same regions as the other elements and also have structures which enable the number of manufacturing steps thereof to be decreased.

SUMMARY OF THE INVENTION

Accordingly, a primary object of the present invention is to provide a field-effect semiconductor device having through holes in a semiconductor substrate, in which passive elements such as capacitors or resistors are formed by using the through holes so as to improve the integration degree.

Another object of the present invention is to provide the above-mentioned field-effect semiconductor device having a via-hole type of FET in which a capacitor is formed between an electrode opposite the through hole of the FET and ground.

Still another object of the present invention is to provide the above-mentioned field-effect semiconductor device in which improved grounding characteristics can be obtained.

Still a further object of the present invention is to provide the above-mentioned field-effect semiconductor device in which wirings connected to the passive elements can be simplified or eliminated.

The above objects and features of the present invention will be more apparent from the following description of the preferred embodiments with reference to the accompanying drawings.

DESCRIPTION OF THE PREFERRED EMBODIMENTS

Before describing the preferred embodiments of the present invention, a contentional device, and the problems involved therein, is first explained with reference to FIGS. 1 through 3.

Figure 1:
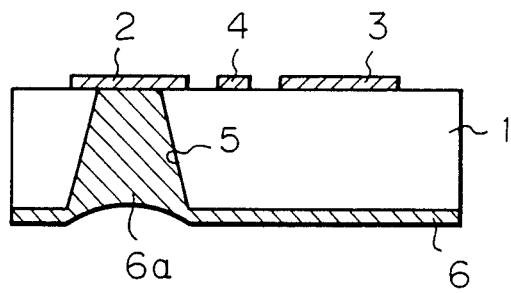
FIG. 1 is a cross-sectional view of a conventional FET.

FIG. 1 is a cross-sectional view of a main portion of a conventional through-hole type of FET. In FIG. 1, 1 designates a semiconductor substrate, 2 a source electrode, 3 a drain electrode, 4 a gate electrode, 5 a through hole, 6 a bottom-surface electrode formed on the bottom surface of the semiconductor substrate 1, and 6a a through-hole electrode inserted into the through-hole 5 so as to connect the source electrode 2 to the bottom surface electrode 6.

Figure 2:
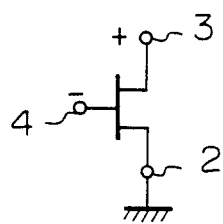
FIG. 2 is an equivalent circuit diagram of the FET of FIG. 1.

An equivalent circuit diagram of the device of FIG. 1 is shown in FIG. 2, wherein the same reference numerals designate the same portions as in FIG. 1. To operate the FET of FIG. 2, a positive voltage of, for example, +3 V is applied to the drain electrode 3, a negative voltage of, for example, −2 V is applied to the gate electrode 4, and the source electrode 2 is grounded, i.e., 0 volts are applied to the source electrode 2. Thus, the circuit of FIG. 2 requires two power supplies, i.e., a plus voltage power supply and a minus voltage power supply.

Recently, there has been a great need to operate an FET using a single power supply to prevent the destruction of the FET and to decrease the cost thereof.

Figure 3:
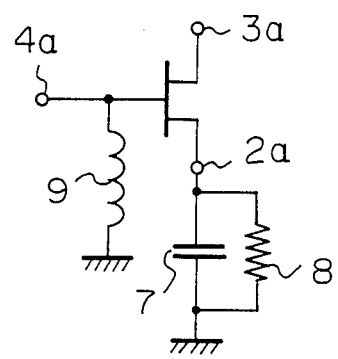
FIG. 3 is a conventional circuit diagram of the FET of FIG. 2 including a self-bias circuit.

FIG. 3 is a conventional circuit diagram of an FET operated by a single power supply. In FIG. 3, 2a, 3a, and 4a designate a source electrode, a drain electrode, and a gate electrode, respectively, of an FET which is not a through-hole type of FET. Reference numerals 7, 8, and 9 designate a capacitor, a resistor, and an inductor, respectively, which form a self-bias circuit. In the self-bias circuit, between the source electrode 2a and ground, the capacitor 7 and the resistor 8 are connected in parallel. The inductor 9 is connected between the gate electrode 4a and ground. Thus, with respect to a high-frequency current, the source electrode 2a is almost directly grounded via the capacitor 7. When a positive voltage of, for example, 5 V is applied to the drain electrode 3a, the voltage at the source electrode 2a becomes 2 V, for example, due to a voltage drop across the resistor 8. The gate electrode 4a is grounded with respect to a direct current so that its voltage is 0 volts. Therefore, the voltage at the gate electrode 4a is lower than the voltage at the source electrode 2a by about 2 V. In other words, the gate electrode 4a is self-biased so that the FET of FIG. 3 can be operated by a single power supply (not shown) connected to the drain electrode 3a.

The through-hole type of FET in FIGS. 1 and 2 has an advantage in that the source electrode 2 is easily and surely grounded by the through-hole electrode 6a. However, since the source electrode 2 is directly grounded, a capacitor cannot be connected between the source electrode 2 and ground. Therefore, the circuit of FIG. 3, including the self-bias circuit, cannot be constructed by means of the through-hole type of FET.

When an FET without a through hole is used to form the circuit of FIG. 3, it is easy to form a capacitor in the semiconductor device and to connect the source electrode of FET to the ground via the capacitor so as to stop a direct current from flowing. However, in this case, the capacitor occupies an area which is not used by the other elements on the semiconductor chip and thereby the integration degree is deteriorated. Further, wirings such as those between the source electrode of the FET and the electrode of the capacitor, between the electrode of the capacitor and ground, and so forth, become complex, with the result that the grounding characteristics may be poor.

There are many circuits, such as matching circuits, which require capacitors and FETs. Problems similar to those mentioned above occur in such circuits. The embodiments of the present invention are now described.

Figure 4A:
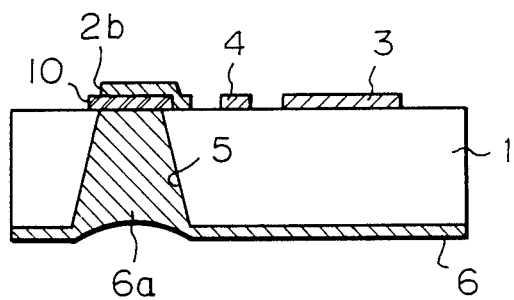
FIG. 4A is a cross-sectional view of a field-effect semiconductor device according to a first embodiment of the present invention.
Figure 4B:
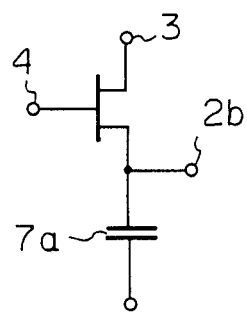
FIG. 4B is an equivalent circuit diagram of the device of FIG. 4A.

FIG. 4A is a cross-sectional view of a field-effect semiconductor device according to a first embodiment of the present invention, and FIG. 4B is an equivalent circuit diagram of the device of FIG. 4A. In these figures and the following figures, the same reference numerals designate the same portions as illustrated in FIGS. 1 and 2.

The difference between this embodiment and the conventional device of FIG. 1 is that in FIG. 4A, between the through-hole electrode 6a and one part of a source electrode 2b, a dielectric film 10 of, for example, $SiO_2$ is formed. Another part of the source electrode 2b is in contact with the surface of the semiconductor substrate 1. The source electrode 2b, the dielectric film 10, and the through-hole electrode 6a form a capacitor 7a as shown in FIG. 4B. When the bottom-surface electrode 6 is grounded and the source electrode 2b is grounded via a resistor (not shown), the self-bias circuit shown in FIG. 3 can be easily realized by the device of FIG. 4A. Also, when the source electrode 2b is directly grounded, the circuit of FIG. 2 can be realized.

Figure 5A:
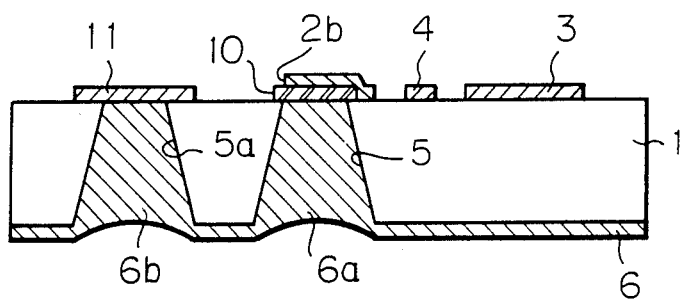
FIG. 5A is a cross-sectional view of a field-effect semiconductor device according to a second embodiment of the present invention.
Figure 5B:
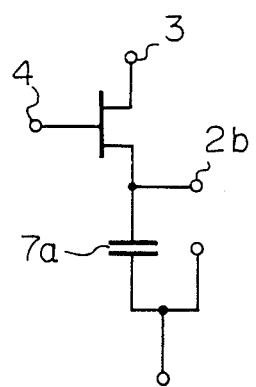
FIG. 5B is an equivalent circuit diagram of the device of FIG. 5A.

FIG. 5A is a cross-sectional view of a field-effect semiconductor device according to a second embodiment of the present invention, and FIG. 5B is an equivalent circuit diagram of FIG. 5A. The difference between FIG. 4A and FIG. 5A is that, in FIG. 5A, a direct-current grounding electrode 11 is formed near the source electrode 2b and on the surface of the semiconductor substrate 1, and under the electrode 11, another through-hole 5a is formed through the semiconductor substrate 1. In the through hole 5a, a through-hole electrode 6b is buried so as to connect the direct-current grounding electrode 11 to the back-surface electrode 6. When a resistor (not shown) is connected between the source electrode 2b and the direct-current grounding electrode 11, the self-bias circuit shown in FIG. 3 can be realized. Also, when a conductive lead, instead of a resistor, is connected between the source electrode 2b and the direct-current grounding electrode 11, the circuit of FIG. 2 can be realized.

Figure 6A:
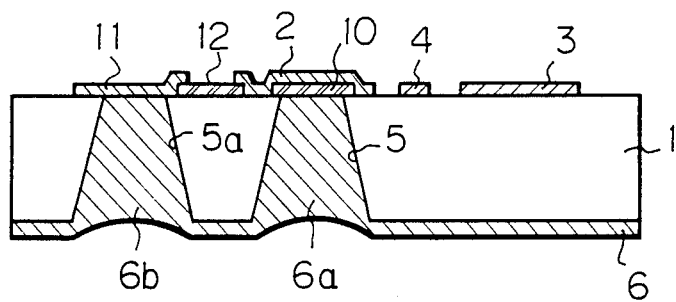
FIG. 6A is a cross-sectional view of a field-effect semiconductor device according to a third embodiment of the present invention.
Figure 6B:
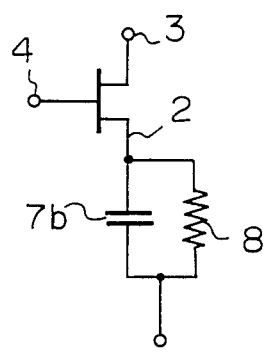
FIG. 6B is an equivalent circuit diagram of the device of FIG. 6A.

FIG. 6A is a cross-sectional view of a field-effect semiconductor device according to a third embodiment of the present invention, and FIG. 6B is an equivalent circuit diagram of FIG. 6A. The difference between FIG. 5A and FIG. 6A is that, in FIG. 6A, a resistive film 12 is formed on the surface of the semiconductor substrate 1 and between the source electrode 2 and the direct-current grounding electrode 11. This resistive film 12 functions as the resistor 8 shown in FIG. 6B. Thus, the self-bias circuit shown in FIG. 3 can be realized.

The description of the foregoing embodiments mainly relates to a self-biased through-hole type of FET. The present invention, however, is not restricted to the above embodiments, and various other applications are possible. For example, in accordance with the circuit design, a capacitor may alternatively be formed, between a gate electrode or a drain electrode and a through hole of the viahole type of FET, when the through hole is formed so as to be opposite to the gate electrode or the drain electrode.

Figure 7A:
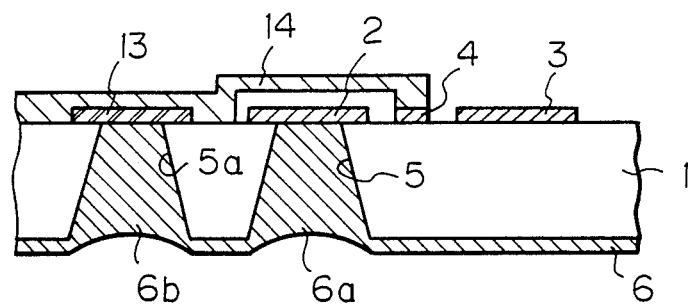
FIG. 7A is a cross-sectional view of a field-effect semiconductor device according to a fourth embodiment of the present invention.
Figure 7B:
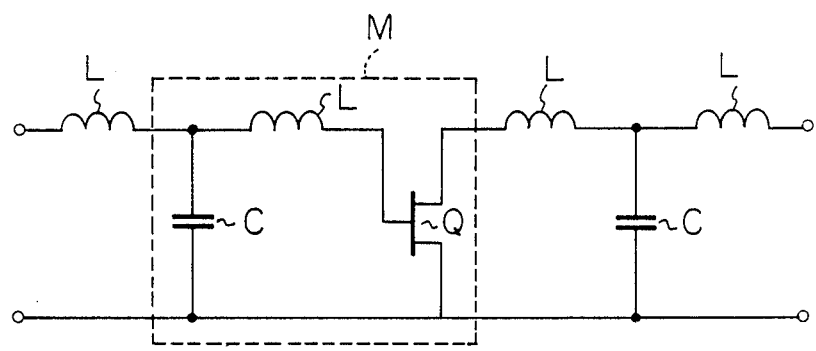
FIG. 7B is an amplifier circuit including an equivalent circuit diagram of the device of FIG. 7A.

FIG. 7A is a cross-sectional view of a low-pass filter type of amplifier circuit device according to a fourth embodiment of the present invention, and FIG. 7B is a low-pass filter type of amplifier circuit including an equivalent circuit diagram of the device of FIG. 7A and a matching circuit. In FIG. 7A, part of a low-pass filter type of amplifier circuit device is illustrated. On the surface of the semiconductor substrate 1 and opposite to the second through-hole electrode 6b, a second dielectric film 13 is formed. The gate electrode 4 and the second dielectric film 13 are connected by a conductive layer 14. Thus, as FIG. 7B shows, a capacitor C is formed between the conductive layer 14 and the second through-hole electrode 6b. The conductive layer 14 functions as an inductor L.

In FIG. 7B, a circuit M enclosed by the broken line is an equivalent circuit diagram of the device of FIG. 7A. The circuit of FIG. 7B is a well-known low-pass filter type amplifier circuit including an FET, capacitors C, and inductors L. It will be understood that the two series connected inductors L and one capacitor C, connected to the inductors L, comprise a matching circuit, and that all of the elements Q, C, and L can be formed so as to have a structure similar to that of the device of FIG. 7A.

In the foregoing embodiments, the dielectric film 10 or 13 on the through-hole electrode 6a or 6b is used to form a capacitor. However, when impurities which supply carriers are included in the dielectric film 10 or 13, the dielectric film acts as a resistor. The resistance value R(Ω) and the capacitance value C(F) are determined by the following well-known equations (1) and (2), respectively:

$$R = \rho \frac{L}{S} \quad (1)$$

where $\rho$ is the specific resistivity (Ωm) of the resistor, S is the cross-sectional area (m$^2$) of the resistor, and L is the length (m) of the resistor $$C = \epsilon \frac{S}{d} \quad (2)$$

where $\epsilon$ is the dielectric constant of the material between the electrodes of the capacitor, d is the distance between the electrodes of the capacitor and S is the cross-sectional area (m$^2$) of the electrodes of the capacitor.

In a field-effect semiconductor device, the resistance value and the capacitance value must be accurate. To obtain an accurate resistance or capacitance, the thickness of the dielectric film must be critically controlled, as will be understood from the above equations (1) and (2). It is, however, difficult to accurately control the thickness of the dielectric film by a conventional technique because, after the dielectric film is formed on the semiconductor substrate 1, a through hole is formed by etching from the bottom surface of the semiconductor substrate, and, at the end of the etching process, the dielectric film may also be etched or part of the semiconductor substrate may remain under the dielectric film.

In order to obtain an accurate capacitance or resistance, according to the present invention, the dielectric film has an etching rate lower than the etching rate of the semiconductor substrate so that the thickness of the dielectric film is accurately predetermined. Thus, the etching for forming the through hole is accurately ended at the top surface of the semiconductor substrate and, the resultant resistance or capacitance realized by the dielectric film is very accurate.

As an example, the semiconductor substrate is made of semi-insulating GaAs, the dielectric film is made of aluminum gallium arsenic (AlGaAs) and is formed by molecular beam epitaxy (MBE), and the through hole is etched by reactive sputtering using a reactive gas such as dichlorodifluoromethane (CCl$_2$F$_2$), etc.

Figure 8:
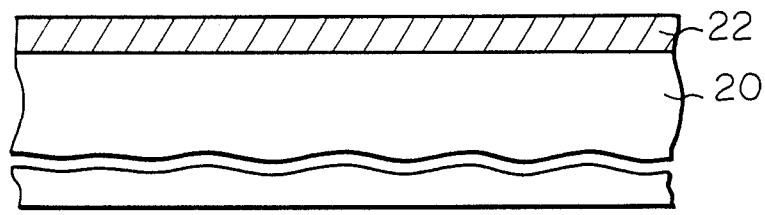
FIGS. 8 through 10 are the manufacturing steps of a capacitor included in any one of the above embodiments.
Figure 9:
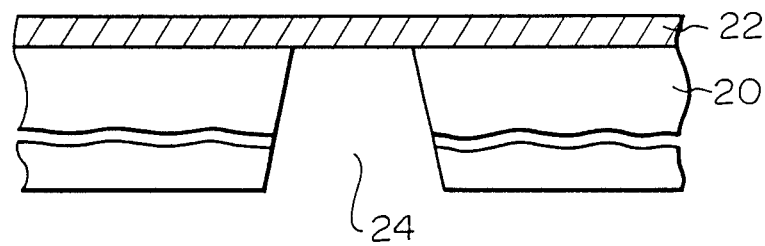
Figure 10:
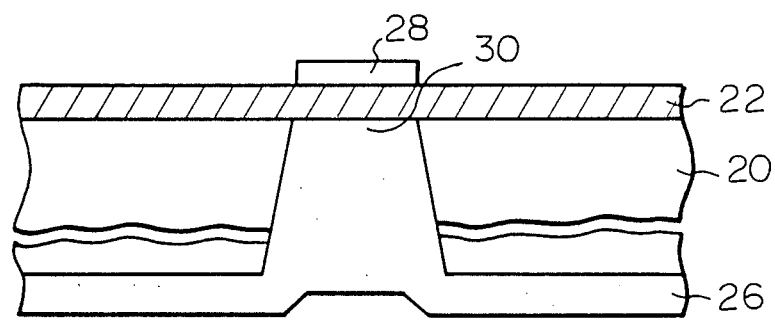

FIGS. 8 through 10 illustrate the manufacturing steps of a capacitor included in any one of the foregoing embodiments.

In FIG. 8, on a semi-insulating GaAs substrate 20 having a thickness of about 400 μm, a dielectric film 22 made of semi-insulating AlGaAs, where Al is 30% and Ga is 70%, (hereinafter referred to as Al$_{0.3}$Ga$_{0.7}$As) is formed by means of metal-organic compound chemical vapor deposition, MBE, and so forth so as to have a desired thickness. The thickness of the dielectric film 22 is determined by the capacitance of the capacitor to be manufactured.

In accordance with the circuit design, an N-type AlGaAs layer (not shown) may be formed under the dielectric film 22.

In FIG. 9, the semi-insulating GaAs substrate 20 is abraded mechanically or chemically from the bottom surface so that it has a desired thickness of from 10 μm through 300 μm. Then a through hole 24 extending to the bottom surface of the dielectric film 22 is formed. The step of forming the through hole is carried out by reactive sputtering by using a reactive gas such as CCl$_2$F$_2$, etc. In this step, since the etching rate of the semi-insulating GaAs substrate 20 is two hundred times higher than the etching rate of the dielectric film 22 made of Al$_{0.3}$Ga$_{0.7}$As, only the semi-insulating GaAs substrate 20 is selectively etched.

In FIG. 10, under the semi-insulating GaAs substrate 20, a bottom-surface electrode 26 is formed by means of a well known plated heat sink technique (PHS). That is, the back-surface electrode 26 is made of gold germanium formed by means of vacuum evaporation so as to extend into the through hole 24, and gold plating is carried out on the surface of the gold germanium. Then, on the dielectric film 22 of semi-insulating Al$_{0.3}$Ga$_{0.7}$As, an upper electrode 28 is formed from aluminum (Al), gold (Au), gold-germanium (AuGe), gold-germanium-nickel (AuGeNi), or other conductive materials, by means of sputtering and photo-lithography. Thus, a capacitor according to the present invention is completed.

The upper electrode 28 is connected to a selected source, drain, or gate electrode of a GaAs FET formed in an N-type GaAs active layer (not shown) which is selectively formed on or in the semi-insulating GaAs substrate 20 by means of a well known mesa etching or ion injection method.

The capacitance of the resultant capacitor is determined by the thickness of the dielectric film 22, the area of the surface of the upper electrode 28 opposite to the dielectric film 22, and the area of the upper surface of a through-hole electrode 30 in the via hole 24. Assume that the shape of the portion of the upper electrode 28 in contact with the dielectric film 22 is a square having one side being 50 μm, and that the shape of the portion of the through-hole electrode 30 in contact with the dielectric film 22 is the same as that of the upper electrode 28. In such a case, when a capacitance of about 2.7 pF is to be obtained, the thickness d of the dielectric film 22 is determined by inserting the following numbers into the before-described equation (2):

$C = 2.7 \text{ (pF)} = 2.7 \times 10^{-12} \text{ (F)}$ $\epsilon = 12.2 \times 8.854 \times 10^{-12} \text{ (F/m)}$ $S = 50^2 \text{ (μm}^2\text{)} = (50 \div 10^{-6})^2 \text{ (m}^2\text{)}$ Then the thickness d can be obtained as:

$$d = \frac{\epsilon S}{C} = 1,000 \times 10^{-10} \text{ (m)} = 1,000 \text{ (Å)}$$

In this case, since the thickness of the dielectric film 22 is extremely thin, i.e., 1,000 (Å), it is preferable that the growing speed of a chemical compound such as Al-GaAs for forming the dielectric film 22 be relatively slow so as to control the thickness as accurately as possible.

When the dielectric film 22 is used as a resistor, a desired resistance can be obtained by introducing impurities of a desired type of conductivity into the dielectric film 22 of AlGaAs. In the above-described equation (1), L is the thickness of the dielectric film 22.

Thus, according to the above-mentioned steps, a capacitor or a resistor can be formed together with a through-hole electrode without adding more steps to the conventional steps.

From the foregoing description of the embodiments, it will be apparent that, according to the present invention, since a large capacitor, formed by a through-hole electrode, an electrode selected from among a source, a drain, and a gate electrode of a through-hole type of FET, and a dielectric film formed between the through-hole electrode and the selected electrode, is grounded a high-frequency current conducted through the selected electrode is grounded via the capacitor, and a direct current conducted through the selected electrode is not grounded. Accordingly, a field-effect semiconductor device including passive elements such as self-bias circuits or matching circuits including passive elements, such as capacitors, can be formed together with through-hole type FETs so that the integration degree, the grounding characteristics, and the wirings connected to the passive elements of the field-effect semiconductor device are all improved.

I claim:

1. A field-effect semiconductor device including a capacitor having electrodes, comprising:
    a semiconductor substrate having a bottom-surface and a top-surface, said semiconductor substrate being etched at a first rate and having a through-hole formed therein;
    a first through-hole electrode selectively formed in said through-hole in said semiconductor substrate so as to penetrate from the bottom-surface to the top-surface of said semiconductor substrate and directly contacting the top-surface of said semiconductor substrate, said first through-hole electrode providing a substantially flat surface co-planar with said top-surface of said substrate;
    a dielectric film having a first surface formed directly on said first through-hole electrode and formed from a material different from the semiconductor substrate, said dielectric film being etched at a second rate different from said first rate when the same etchant is employed, said first surface being a stoppage surface for stopping the etching of said semiconductor substrate;
    a first electrode of a field-effect transistor, said first electrode extending onto said dielectric film and contacting said dielectric film and the top-surface of said semiconductor substrate; and
    a bottom-surface electrode formed on the bottom-surface of said semiconductor substrate, said bottom-surface electrode together with said first through-hole electrode forming a single electrode, said single electrode being one of the electrodes of the capacitor.

2. A field-effect semiconductor device as set forth in claim 1, wherein said first electrode of said field-effect transistor is one selected from among a source electrode, a gate electrode, and a drain electrode.

3. A field-effect semiconductor device as set forth in claim 2, wherein said first electrode, said dielectric film, and said first through-hole electrode form the capacitor.

4. A field-effect semiconductor device as set forth in claim 3, wherein said first electrode is said source electrode of said field-effect transistor.

5. A field-effect semiconductor device as set forth in claim 4, wherein said bottom-surface electrode is grounded.

6. A field-effect semiconductor device as set forth in caim 4, further comprising:
    a second through-hole electrode formed in said semiconductor substrate so as to penetrate from the bottom surface to the top surface of said semiconductor substrate, said second through-hole electrode together with said bottom-surface electrode forming a single electrode; and
    a second electrode formed on the top surface of said semiconductor substrate and contacting said second through-hole electrode.

7. A field-effect semiconductor device as set forth in claim 6, further comprising a resistive film formed on said semiconductor substrate between said first electrode and said second electrode, said resistive film formed from a semiconductor material having a second etching rate, the second etching rate being different from the first etching rate of said semiconductor substrate.

8. A field-effect semiconductor device as set forth in claim 1, wherein said first electrode is a gate electrode of said field-effect transistor, said field-effect semiconductor device further comprising:
    a source electrode of said field-effect transistor, formed on said semiconductor substrate;
    a second through-hole formed under said source electrode and in said semiconductor substrate so as to penetrate from the bottom surface to the top surface of said semiconductor substrate;
    a second through-hole electrode formed in said second through-hole, said second through-hole electrode together with said bottom-surface electrode forming a single electrode; and
    a conductive layer formed on said semiconductor substrate between said gate electrode and said dielectric film.

9. A field-effect semiconductor device as set forth in claim 8, wherein said conductive layer comprises an inductor.

10. A field-effect semiconductor device as set forth in claim 9, wherein said device comprises a matching circuit.

11. A field-effect semiconductor device as set forth in claim 7, wherein said resistive film is of a semiconductor material doped with impurity ions so as to form a resistor.

12. An integrated circuit device including a field-effect transistor having an electrode and at least one capacitor, said capacitor comprising:
    a semiconductor substrate having a bottom-surface and a top-surface, said semiconductor substrate being etched at a first rate and having a through-hole formed therein;
    a through-hole electrode selectively formed in said through-hole in said semiconductor substrate extending from the bottom-surface to the top-surface of said semiconductor substrate and directly contacting the top-surface of said semiconductor substrate, said through-hole electrode providing a substantially flat surface co-planar with said top-surface of said substrate;

a dielectric film formed directly on the surface of said through-hole electrode, and formed from a material different from that of said semiconductor substrate, said dielectric film being etched at a second rate, different from said first rate, when the same etchant is employed, said dielectric film stopping the etching of said semiconductor substrate;

the electrode of the field-effect transistor contacting said dielectric film and the top-surface of said semiconductor substrate; and a bottom-surface electrode formed on said bottom-surface of said semiconductor substrate, said bottom-surface electrode together with said through-hole electrode forming a single electrode for the capacitor.

* * * * *

UNITED STATES PATENT AND TRADEMARK OFFICE
CERTIFICATE OF CORRECTION

PATENT NO. : 4,751,562
DATED : JUNE 14, 1988
INVENTOR(S) : SHIGEYUKI YAMAMURA

It is certified that error appears in the above-identified patent and that said Letters Patent is hereby corrected as shown below:

```
Col. 1, line 66, "via-hole" should be --through-hole--.

Col. 2, line 48, "contentional" should be --conventional--.

Col. 3, line 41, delete "the" (first occurrence).

Col. 4, line 19, "back-surface" should be --bottom-surface--;
        line 45, "viahole" should be --through-hole--.

Col. 6, line 21, "back-surface" should be --bottom-surface--;
        line 43, "via" should be --through--.

Col. 7, line 18, "electrode, is grounded a" should be
                 --electrode is grounded, a--.

Col. 8, line 11, "caim" should be --claim--.
```

Signed and Sealed this

First Day of November, 1988

Attest:

DONALD J. QUIGG

*Attesting Officer*

*Commissioner of Patents and Trademarks*